United States Patent
Redman-White et al.

(10) Patent No.: US 10,205,532 B2
(45) Date of Patent: Feb. 12, 2019

(54) LASER POWER CONTROLLER

(71) Applicant: Hilight Semiconductor Limited, Southampton, Hampshire (GB)

(72) Inventors: William Redman-White, Southampton (GB); Dominique Coue, Southampton (GB); Colin Whitfield, Southampton (GB)

(73) Assignee: HILIGHT SEMICONDUCTOR LIMITED, Hampshire (GB)

( * ) Notice: Subject to any disclaimer, the term of this patent is extended or adjusted under 35 U.S.C. 154(b) by 0 days.

(21) Appl. No.: 15/643,958

(22) Filed: Jul. 7, 2017

(65) Prior Publication Data

US 2018/0019823 A1    Jan. 18, 2018

(30) Foreign Application Priority Data

Jul. 8, 2016   (GB) .................................. 1611938.0

(51) Int. Cl.
*H04B 10/564*   (2013.01)
*H01S 5/0683*   (2006.01)
(Continued)

(52) U.S. Cl.
CPC ......... *H04B 10/564* (2013.01); *H01S 3/1306* (2013.01); *H01S 5/0427* (2013.01);
(Continued)

(58) Field of Classification Search
CPC .. H01S 5/06832; H01S 5/06835; H01S 5/042; H01S 5/0427; H01S 5/0428;
(Continued)

(56) References Cited

U.S. PATENT DOCUMENTS

| | | | |
|---|---|---|---|
| 4,612,671 A | | 9/1986 | Giles |
| 4,709,416 A | * | 11/1987 | Patterson ............. H04B 10/564 |
| | | | 398/197 |

(Continued)

FOREIGN PATENT DOCUMENTS

| | | | |
|---|---|---|---|
| GB | 1539624 A | * 1/1979 | ......... H01S 5/06832 |
| GB | 2187056 A | 8/1987 | |
| WO | 1993013577 A1 | 7/1993 | |

OTHER PUBLICATIONS

Examination Report issued in co-pending application No. GB1611938.0 dated Sep. 28, 2017.

(Continued)

*Primary Examiner* — Joshua King
(74) *Attorney, Agent, or Firm* — Squire Patton Boggs (US) LLP

(57) ABSTRACT

A laser power controller employs: selection circuitry configured to select one of a data input value, a logical high value or a logical low value such that the selection circuitry selects the data input value during a data transmission period during a defined burst period and selects one of the logical high value and the logical low value during an extension time period during the defined burst period and immediately following the data transmission period; drive circuitry configured to apply, to a laser diode, a current corresponding to the value selected by the selection circuitry during the defined burst period or a zero value otherwise, the current being such that the laser diode is configured to provide an optical output; an optical sensor module configured to provide a sensor module output corresponding to the optical output of the laser diode, and configured to provide an electrical output proportional to the laser diode's optical output corresponding to the logical high value or the logical low value; and a controller configured to receive desired values regarding minimum and maximum optical output (Continued)

power levels of the laser diode and to receive the electrical output from the optical sensor module proportional to the optical output power level corresponding to the logical high and the logical low values; the controller being configured to use the received information to provide control values for the drive circuitry.

21 Claims, 7 Drawing Sheets

(51) Int. Cl.
*H01S 5/068* (2006.01)
*H01S 5/042* (2006.01)
*H01S 3/13* (2006.01)
*H04B 10/50* (2013.01)

(52) U.S. Cl.
CPC ........ *H01S 5/0683* (2013.01); *H01S 5/06832* (2013.01); *H01S 5/06835* (2013.01); *H04B 10/503* (2013.01); *H01S 5/06812* (2013.01)

(58) Field of Classification Search
CPC ... H01S 5/0261; H04B 10/503; H04B 10/504; H04B 10/564
See application file for complete search history.

(56) References Cited

U.S. PATENT DOCUMENTS

| | | | | |
|---|---|---|---|---|
| 5,502,298 | A | | 3/1996 | Geller |
| 5,710,787 | A | | 1/1998 | Amada et al. |
| 5,850,409 | A | * | 12/1998 | Link .................. H01S 5/06832 372/38.01 |
| 6,219,165 | B1 | * | 4/2001 | Ota ..................... H04B 10/695 398/197 |
| 6,370,175 | B1 | * | 4/2002 | Ikeda ................. H04N 1/40037 347/236 |
| 7,792,166 | B2 | | 9/2010 | Borschowa |
| 8,971,364 | B2 | * | 3/2015 | Hoffman ............ H01S 5/06808 372/38.01 |
| 2003/0035451 | A1 | * | 2/2003 | Ishida ..................... H01S 5/042 372/38.02 |
| 2003/0091076 | A1 | * | 5/2003 | Fischer .................. H01S 5/042 372/38.02 |
| 2004/0109696 | A1 | * | 6/2004 | Toshihisa ............. H04B 10/503 398/198 |
| 2006/0108501 | A1 | * | 5/2006 | Draper ............... H01S 5/06804 250/205 |
| 2007/0286609 | A1 | * | 12/2007 | Ikram .................. H04B 10/564 398/197 |
| 2011/0033193 | A1 | * | 2/2011 | Nakamura ............ G02F 1/0123 398/183 |
| 2012/0051379 | A1 | * | 3/2012 | Wang ..................... H01S 5/042 372/38.01 |
| 2012/0106953 | A1 | | 5/2012 | Nguyen et al. |
| 2014/0270752 | A1 | * | 9/2014 | Onaka ............... H04B 10/0779 398/23 |
| 2015/0188627 | A1 | * | 7/2015 | Yuda .................... H04B 10/502 398/30 |

OTHER PUBLICATIONS

International Search Report issued in PCT/EP2017/067090 dated Sep. 11, 2017.
Combined Search and Examination Report from Application No. GB1611938.0 dated Aug. 16, 2016.

* cited by examiner

Prior Art

LASER POWER CONTROLLER

BACKGROUND OF INVENTION

In a fibre optical communications system, it is important to be able to control the output power of the transmitting laser diode for a number of reasons. Firstly, the average and peak power of the laser must not exceed certain limits in order to avoid damage. Secondly, the different power levels corresponding to binary (or other radix) data values must be set so that the modulation index (alternatively defined as extinction ratio) is within the overall system specifications to ensure reliable reception at the end of the link. One difficulty to be addressed in any control system is that the characteristics of the laser can change significantly with temperature and also over time with ageing, and diverging from an ideal linear response, so that a conventional factory set up of the "high" and "low" drive current levels is not adequate.

Numerous techniques exist in prior art that describe methods intended to estimate the instantaneous values of the minimum and maximum transmitted optical output and compensate for the changes in device characteristics. Most are limited in their effectiveness due to the restricted bandwidth of the monitor diode and its associated circuitry.

Monitoring the transmitted output power is even more challenging in an optical communications link that transmits the data in a series of discrete bursts, as the average value of the optical output may vary greatly, and the instantaneous levels are not stable enough for most methods described in prior art to reach adequate estimates of minimum and maximum levels. The temperature related effects are likely to be even more severe, as the transmitting laser diode may be in an off state for a long period before being activated for a data burst, and hence may have cooled to ambient temperature before heating up during a data burst.

Hence it is desirable to be able to sense the minimum and maximum optical outputs corresponding to logic "1" and logic "0" during data bursts on a near continuous basis. It is further desirable to be able to make such measurements using a transmit power monitoring function with only moderate bandwidth, and by means that do not disturb the transmitted data payload nor compromise the received signal to noise performance.

SUMMARY OF INVENTION

According to an aspect, there is provided a system comprising selection circuitry configured to select one of a data input value, a logical high value or a logical low value such that the selection circuitry selects the data input value during a data transmission period during a defined burst period and selects one of the logical high value and the logical low value during an extension time period during the defined burst period and immediately following the data transmission period; drive circuitry configured to apply a current to a laser diode, the current corresponding to the value selected by the selection circuitry during the defined or a zero value otherwise, the current being such that the laser diode is configured to provide an optical output; an optical sensor module configured to provide a sensor module output corresponding to the optical output of the laser diode; wherein the sensor module output is configured to provide an electrical output proportional to the laser diode's optical output corresponding to the logical high value or the logical low value; and a controller configured to receive desired values from the optical sensor module regarding minimum and maximum optical output power levels of the laser diode and to receive the electrical output proportional to the optical output power level corresponding to the logical high and the logical low values; wherein the controller is configured to use the received information to provide control values for the drive circuitry.

The optical sensor module may comprise a photodiode output power detector.

The optical sensor module may comprise an optical sensor and a trans-impedance amplifier, the trans-impedance amplifier being configured to provide the sensor module output.

The control values may be configured to control the average power of the optical output of the laser diode.

The control values may be configured to control the peak power of the optical output of the laser diode.

The control values may be configured to control the modulation index of the optical output of the laser diode.

The current may comprise a steady element and a variable element.

The drive circuitry may be configured to set the current applied to the laser diode dependent on a combination of a bias control value and a modulation control value.

The control values may be configured to control the drive circuitry to set the at least one of a bias current and a modulation current applied to the laser diode.

The drive circuitry may comprise bias circuitry configured to provide a bias current to the laser diode.

The drive circuitry may comprise modulation circuitry configured to provide a modulation current to the laser diode.

The drive circuitry may be configured to set the current applied to the laser diode dependent on a combination of an average value and a modulation value.

The burst period may be gated by a burst enable signal.

The duration of the data transmission period may adhere to a standard specification for burst mode operation.

The control values may control the drive circuitry to deliver the optical output desired values regarding desired minimum and maximum optical output power levels.

The extension time period may be greater than a settling time of the sensor module output.

The selection circuitry may alternately select one of the logical high value and logical low value for each consecutive extension time period.

The selection circuitry may select the logical high value or the logical low value for each consecutive extension time period according to a pre-defined sequence.

The selection circuitry may select the logical low value immediately after an extension time period where the logical high value has been selected.

The selection circuitry may comprise a selector switch function.

The bandwidth of the selection circuitry may be configured to switch between the data input, the logical high value and the logical low value in a time significantly less than that of the extension time period.

The system may comprise substantially digital circuits.

The control values may be calculated by a digital calculation function.

The system may comprise substantially analogue circuits.

According to another aspect, there is provided a system comprising means for selecting one of a data input value, a logical high value or a logical low value such that the selection circuitry selects the data input value during a data transmission period during a defined burst period and selects one of the logical high value and the logical low value during an extension time period during the defined burst period and immediately following the data transmission period; means for applying a current to a laser diode, the current corresponding to the value selected by the selection circuitry during the defined burst period or a zero value otherwise, the current being such that the laser diode is configured to provide an optical output; means for providing a sensor module output corresponding to the optical output of the laser diode; wherein the sensor module output is configured to provide an electrical output proportional to the laser diode's optical output corresponding to the logical high value or the logical low value; and means for receiving desired values from the optical sensor module regarding minimum and maximum optical output power levels of the laser diode and to receive the electrical output proportional to the optical output power level corresponding to the logical high and the logical low values; wherein the controller is configured to use the received information to provide control values for the drive circuitry.

The means for providing a sensor module output may comprise a photodiode output power detector.

The means for providing a sensor module output may comprise an optical sensor and a trans-impedance amplifier, the trans-impedance amplifier being configured to provide the sensor module output.

The control values may be configured to control the average power of the optical output of the laser diode.

The control values may be configured to control the peak power of the optical output of the laser diode.

The control values may be configured to control the modulation index of the optical output of the laser diode.

The current may comprise a steady element and a variable element.

The means for applying a current to a laser diode may be configured to set the current applied to the laser diode dependent on a combination of a bias control value and a modulation control value.

The control values may be configured to control the drive circuitry to set the at least one of a bias current and a modulation current applied to the laser diode.

The means for applying a current to a laser diode may comprise bias circuitry configured to provide a bias current to the laser diode.

The means for applying a current to a laser diode may comprise modulation circuitry configured to provide a modulation current to the laser diode.

The means for applying a current to a laser diode may be configured to set the current applied to the laser diode dependent on a combination of an average value and a modulation value.

The burst period may be gated by a burst enable signal.

The duration of the data transmission period may adhere to a standard specification for burst mode operation.

The control values may control the drive circuitry to deliver the optical output desired values regarding desired minimum and maximum optical output power levels.

The extension time period may be greater than a settling time of the sensor module output.

The means for selecting may alternately select one of the logical high value and logical low value for each consecutive extension time period.

The means for selecting may select the logical high value or the logical low value for each consecutive extension time period according to a pre-defined sequence.

The means for selecting may select the logical low value immediately after an extension time period where the logical high value has been selected.

The means for selecting may comprise a selector switch function.

The bandwidth of the selection circuitry may be configured to switch between the data input, the logical high value and the logical low value in a time significantly less than that of the extension time period.

The system may comprise substantially digital circuits.

The control values may be calculated by a digital calculation function.

The system may comprise substantially analogue circuits.

According to another aspect, there is provided a method for communications comprising: selecting one of a data input value, a logical high value or a logical low value such that the data input value is selected during a data transmission period during a defined burst period and one of the logical high value and the logical low value is selected during an extension time period during the defined burst period and immediately following the data transmission period; applying a current to a laser diode, the current corresponding to the selected value during the defined burst period or a zero value otherwise, the current being such that the laser diode is configured to provide an optical output; determining an electrical output proportional to a laser diode's optical output corresponding to the logical high value or the logical low value by using a sensor module output corresponding to the optical output; receiving desired values regarding desired minimum and maximum optical output power levels of the laser diode; and providing control values for the current applied to the laser diode based on the electrical output proportional to the optical output corresponding to the logical high or the logical low value and the received desired values.

The method may comprise providing the sensor module output using a trans-impedance amplifier.

The method may comprise providing the sensor module output using a photodiode output power detector.

The method may comprise controlling the average power of the optical output of the laser diode using the control values.

The method may comprise controlling the peak power of the optical output of the laser diode using the control values.

The method may comprise controlling the modulation index of the optical output of the laser diode using the control values.

The current may comprise a steady element and a variable element.

The method may comprise setting the current applied to the laser diode dependent on a combination of a bias control value and a modulation control value.

The method may comprise controlling at least one of the bias control value and the modulation control value applied to the laser diode using the control values.

The method may comprise setting the current applied to the laser diode dependent on a combination of an average value and a modulation value.

The burst period may be gated by a burst enable signal.

The duration of the data transmission period may adhere to a standard specification for burst mode operation.

The method may comprise controlling the applied current to deliver the optical output desired minimum and maximum optical output power levels using the control values.

The extension time period may be greater than a settling time of the sensor module output.

The method may comprise selecting the logical high value and the logical low value alternately for each consecutive extension time period.

The method may comprise selecting the logical high value or the logical low value for each consecutive extension time period according to a pre-defined sequence.

The method may comprise selecting the logical low value immediately after an extension time period where the logical high value has been selected.

The method may comprise selecting using a selector switch function.

The method may be performed by substantially digital circuits

The method may comprise calculating the control values using a digital calculation function.

The method may be performed by substantially analogue circuits.

BRIEF DESCRIPTION OF THE DRAWINGS

The invention will now be described solely by way of example and with reference to the accompanying drawings in which.

DETAILED DESCRIPTION

The description is not to be taken in a limiting sense but is made merely for the purposes of describing the general principles of the embodiments of the invention. For example, operations that are illustrated as being performed using digital signals and digital circuits may also be achieved using substantially analogue signals and analogue circuits.

Figure 1:
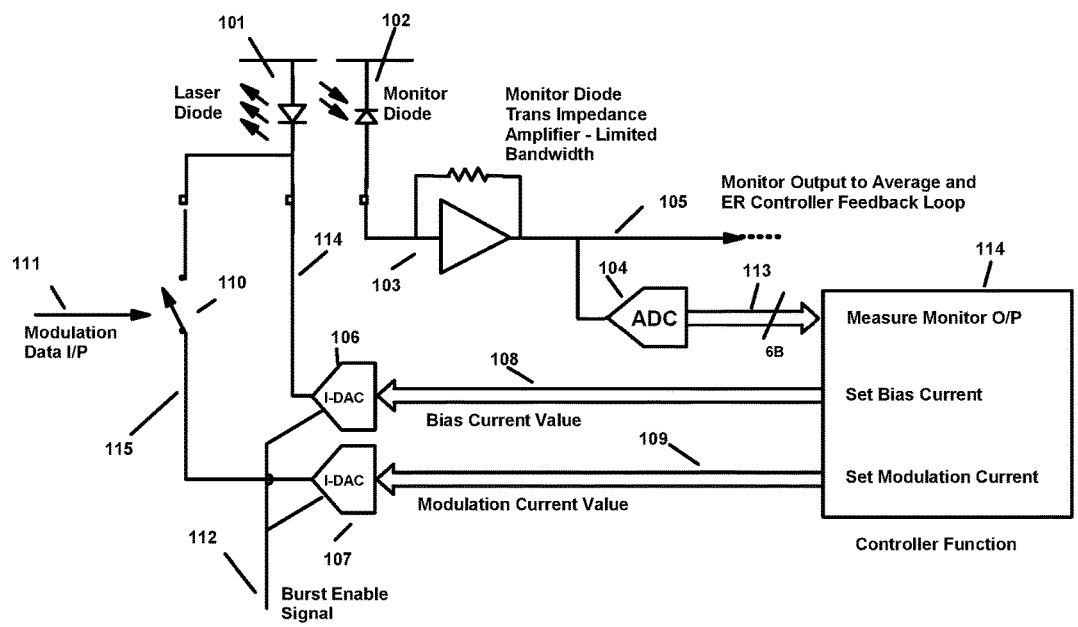
FIG. 1 shows a typical arrangement for a transmitter in a burst-mode optical fibre link.

FIG. 1 shows the typical arrangement in a transmitter suitable for an optical communications system. A laser diode 101 is provided with a current by drive circuitry having a steady element and a variable element. This may be in the form of an average current with a bi-directional modulation current adding and subtracting current to create the optical maxima and minima; or there may be a smaller steady bias current 114 with a modulation current 115 that is disconnected by means of a switching function 110 to indicate a logical low level in the modulation data input 111. The latter variant is represented in the figure. These currents may be provided by digital-to-analogue converters 106 and 107 having current outputs controlled by digital values 108 and 109 respectively that are set by the controller function 118. When operating in a burst mode, these currents may be gated in a manner corresponding to the active periods in a data burst by means of a further signal or signals 112 corresponding the length of the prescribed burst. The optical output of the laser diode 101 is sensed by an optical sensor, such as a monitor photodiode 102 to create a current proportional to the sensed optical level and which may be converted to a voltage 105 with a trans-impedance amplifier 103. The combination of the monitor diode 102 and amplifier 103 typically have a bandwidth that is substantially less than that of the main data channel bandwidth. This monitor value 105 may be converted to digital form 113 by means of an analogue-to-digital converter 104 and these data used by the controller 118 to set the current levels according to some algorithm. The bandwidth limitation of the monitor channel is very significant in the implementation of any transmit optical level control mechanism since it restricts the observability of the peak and trough values of the optical signal.

Figure 2:
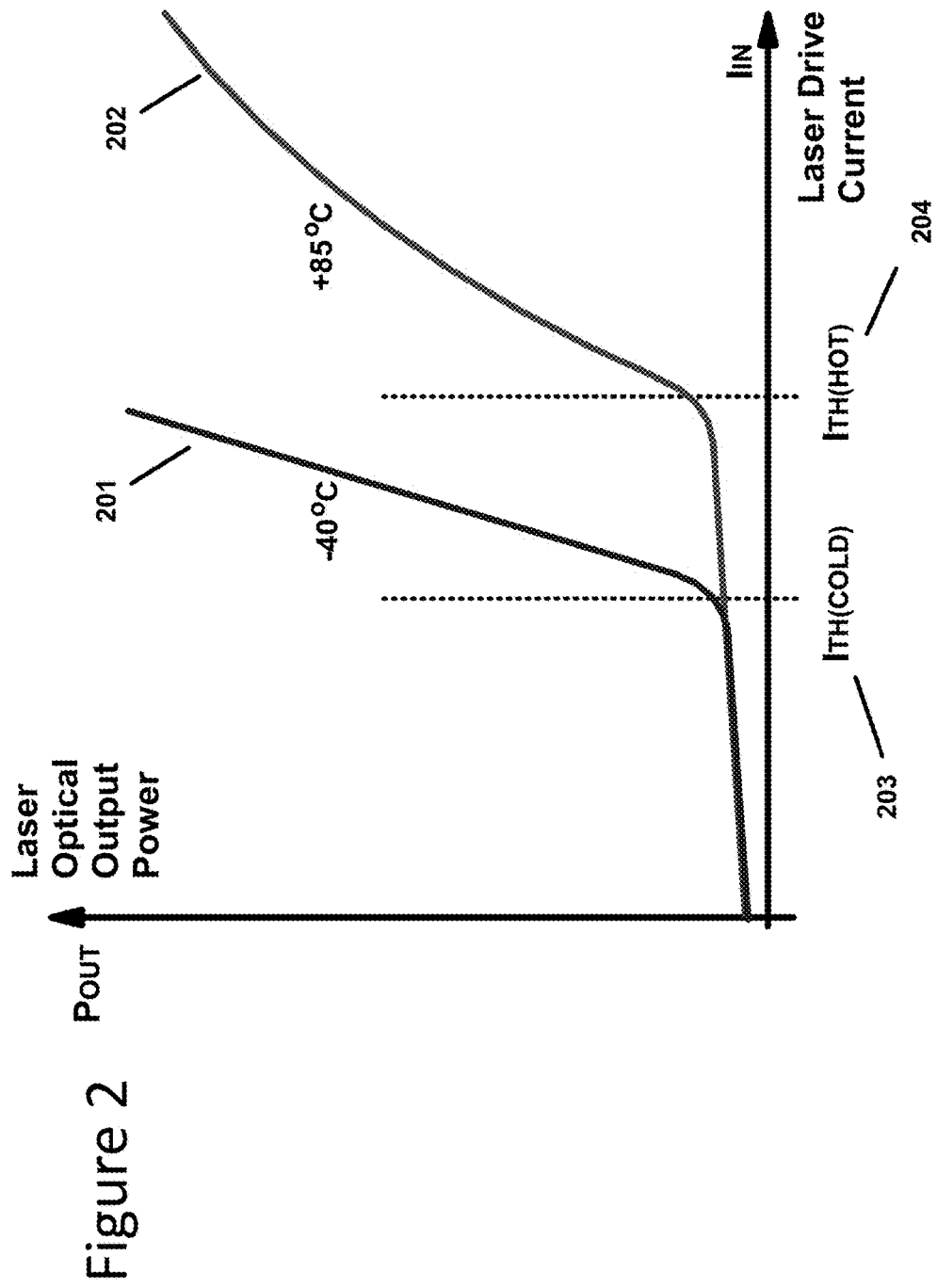
FIG. 2 shows a representation of a laser diode output characteristic and temperature effects.

FIG. 2 is a diagrammatic representation of the characteristics of a typical laser diode as is used in optical communications systems. When used to generate a modulated optical signal, the current through the laser diode is modulated such that the minimum current is above the threshold value 203, for the laser, and the maximum current is below the manufacturer's ratings for the device. When a laser diode is cold, or the current levels are relatively low, a simple linear model 201 may suffice. However, when the laser diode heats up, or as its characteristics change with age, the threshold current may change 204 and the relationship may exhibit a more curved shape 202. Thus, maintaining the desired optical output and the desired ER during operation over a system's lifetime is not considered trivial.

In any given practical system, the maximum current may be set so that the average operating power of the laser is set to a defined level with regard to the required signal level for reliable communications to be established. A critical parameter in such a system is the ratio of the maximum to minimum optical output, usually referred to as the Extinction Ratio (ER), as this affects the signal to noise levels for the receiver. The ER is a function of the minimum and maximum laser diode current values, and is sometimes represented as a simple linear relationship, but in reality this is not an accurate representation.

Figure 3:
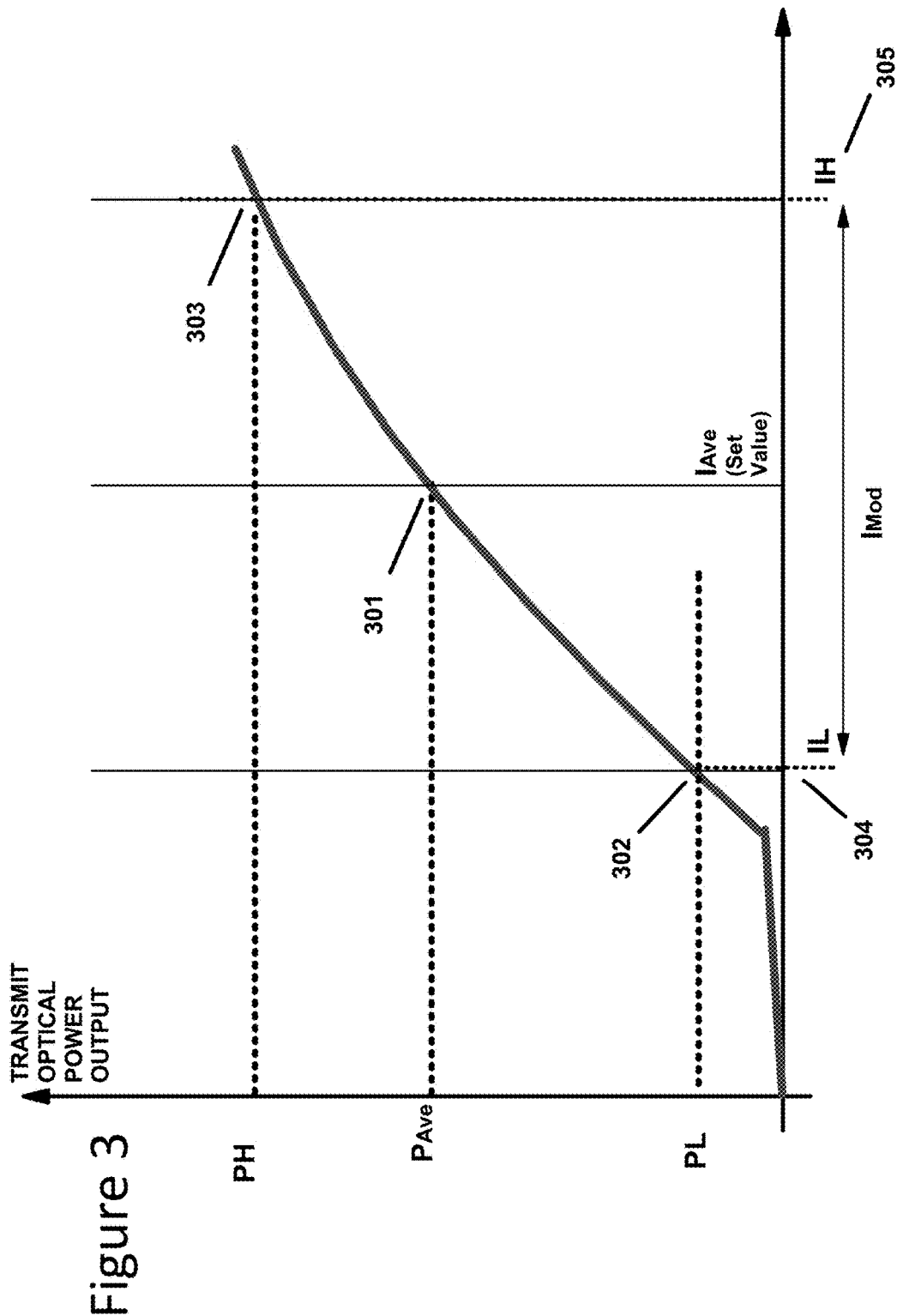
FIG. 3 shows the limitations of conventional estimation methods where there is curvature in the laser characteristic.

FIG. 3 shows how average optical power 301 of a laser diode at an elevated temperature is not suitable as the basis for an accurate estimate of the minimum 302 and maximum 303 optical levels and hence the ER. This also implies that there are problems with controlling the minimum 304 and maximum 305 current levels needed to obtain the desired average power and ER. Where a system operates with a continuous data stream, the average is relatively easy to monitor as the laser can reach a steady state temperature. Further, there is time to gather data from a monitor diode system to measure the peak and trough optical data levels with some kind of averaging of the measurements to provide an estimate of the ER and average optical power. Systems for this purpose are known in prior art (for example, Smith et al, Electronics Letter Vol 14, 1978, and similar derivative arrangements).

Figure 4:
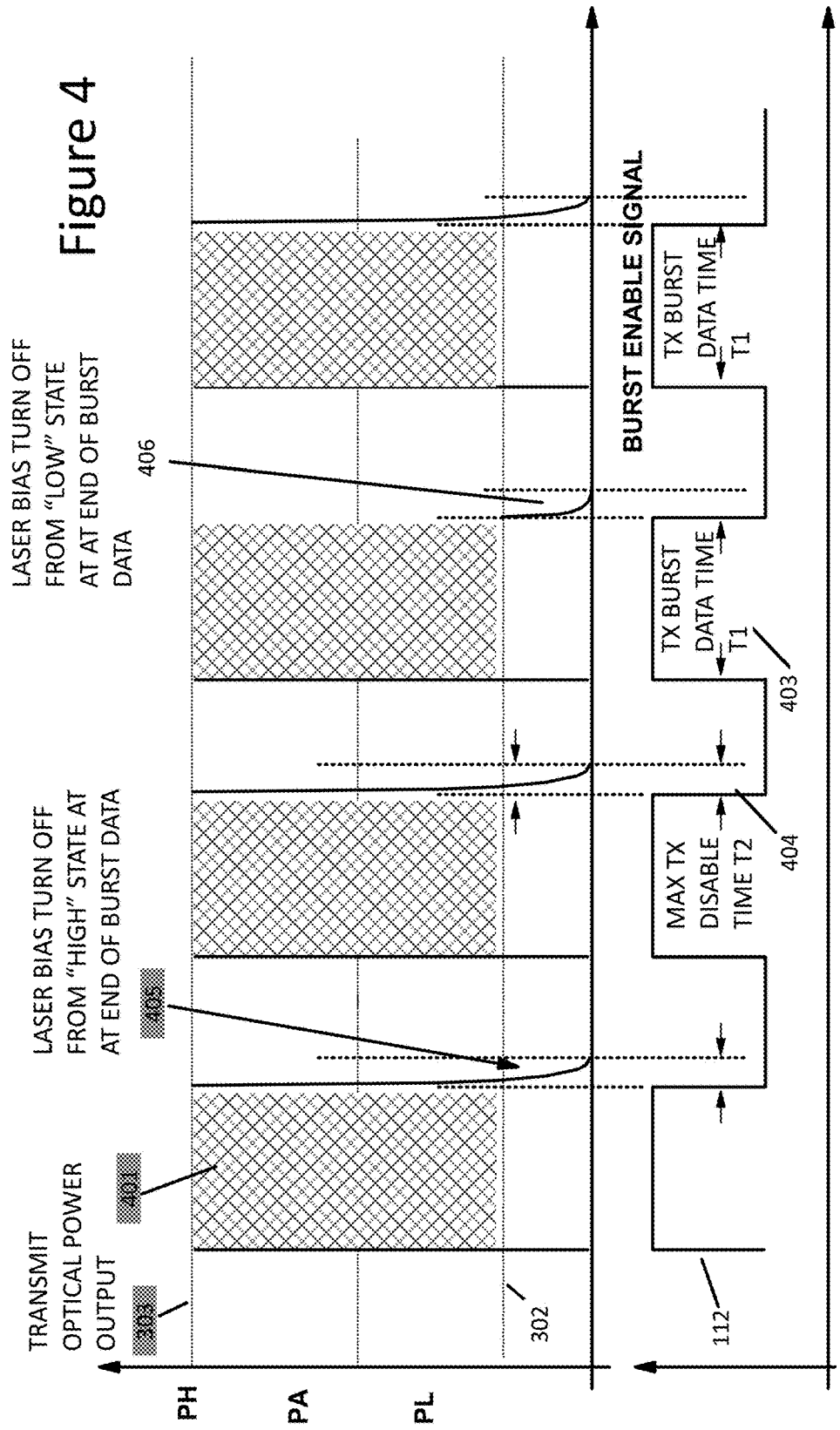
FIG. 4 shows the structure of a typical data burst with typical allowable laser turn off time.

FIG. 4 shows the general form of optical signals intended to transmit data bursts in a system adhering to specifications for burst mode operation, (such as standard ITU-T Recommendation G.984.2). The bias current to the laser is gated by a burst enable signal 112 before data signals 111 are used to modulate the laser output. In such standards the duration T1 of the data burst 403 is precisely defined, and typically of the order of a few 100 nanoseconds. Note that at the end of a data burst, the logical value may be in a high state (a logical high value) or a low state (a logical low value). Such standards also typically define T2 a time interval 404 within which the laser output must return to zero. To allow for the bandwidth of practical bias control systems, this interval is of the order of 10 ns.

In such a burst mode system the problem of controlling the average power and ER is difficult. Before the start of a burst the laser will be in a relatively cool state. As soon as the data packets are transmitted, the laser will begin to heat up and will continue to do so during a typical burst. It is a requirement of the standards that the system be operational after only a short number of training bursts, for example 5 or less, in which the system's operating parameters come under control.

The requirement to be able to establish operating conditions rapidly after the start of a sequence of bursts is not addressed in this disclosure. Leaving this issue to be solved by other means, there remains a requirement to provide means for accurately controlling the extinction ratio of the laser output after the initial training bursts where the laser has substantially warmed up to an elevated average temperature. Any measurement of the peak and trough values has the same monitor channel bandwidth limitations as in a continuous system, but the demands are further complicated by the intermittent nature of the signal making meaningful averaging more difficult.

In an embodiment of the invention means are provided to make rapid and accurate estimates of the instantaneous values of the optical output representing data '1' and data '0' values, or other such values as may be defined. Using said estimates, further means are provided that are able to calculate the required values of bias current and modulation current needed to deliver the desired output levels, and to maintain these notwithstanding changes in the laser characteristics due to short term heating and/or long term ageing.

In FIG. 4 it will be noticed that the time to turn off of the laser after a burst of data is not a constant but depends on the logical value at the end of the data transmission period 401. The laser bias turn off time at the end of a data transmission period from a high state 405 is greater than the laser bias turn off time at the end of a data transmission period from a low state 406. The bandwidth of the modulation circuit 110 in response to the modulation data signal 111 is very fast. Hence rather than use the bias current control to turn off from a high state, the modulation circuit may be used to reduce the laser output very rapidly to the low state first, typically in a time of the order of 10 s of picoseconds. Once the laser output is in said low state, the task of turning off to full extinction becomes much easier. Further, it is not a difficult task to ensure that the bias current 114 responds to the burst enable signal 112 or a substantially equivalent signal in a time interval substantially less than the interval 404 required by the standard. This approach makes available a time interval that while not large is nonetheless greater than the transient settling time typical of such monitor channel circuits. Using this knowledge it is possible to exploit time available in the specified turn off interval 404 to execute valuable measurements of the prevailing optical high and low output levels.

Figure 5:
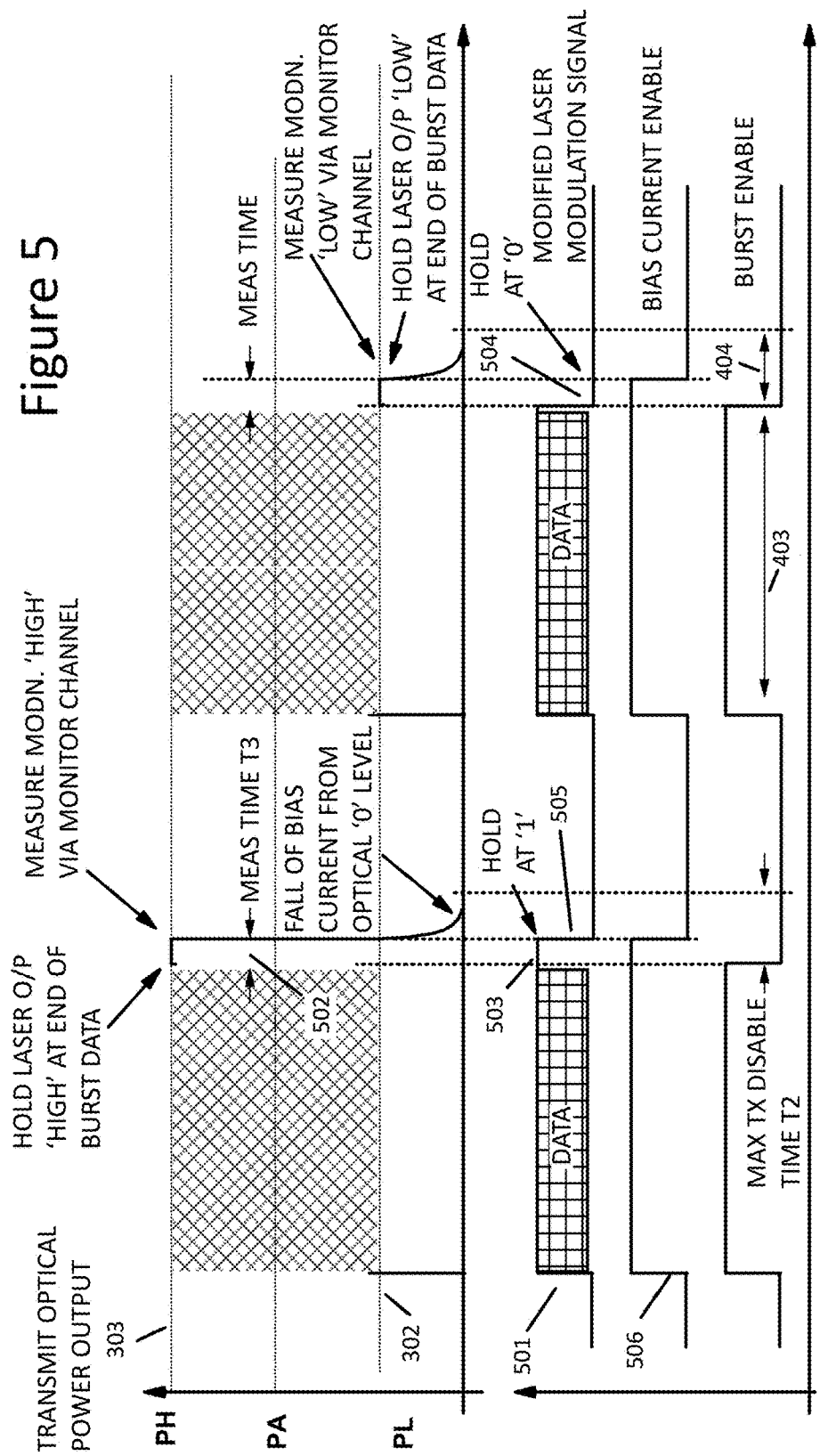
FIG. 5 shows a burst mode optical signal with high and low reference levels embedded within valid data packets.

FIG. 5 shows the optical levels associated with a burst mode system wherein subtle modifications have been made to the transmitted signal that facilitate measurements of the high and low levels. Said modifications are made such that they do not affect the normal transfer of data within the burst packets and do not transgress the specifications set by the relevant standard.

To provide the framework for said modifications a time interval is first defined to satisfy the conditions that it is substantially less than the laser turn off time 405 allowed by the standard but long enough to be substantially longer than the settling time of the monitor channel output 105 and at the same time allows sufficient remaining time within the period 405 for the bias current control circuits to extinguish the laser completely. A feature of the invention is the replacement of the raw data signal 111 with a modified form of the laser modulation signal 501 wherein at the end of each burst a known logical value is held for an extended time period T3 502. At the same time, the bias current to the laser 114 is controlled by a modified version of the burst enable signal (the bias control signal 506) such that the bias remains active for a defined period after the data for that burst has ceased. The logical value of this extension of the data burst is made to alternate between a '1' denoted 503 in FIG. 5 and a '0' denoted 504 in FIG. 5. The duration of this logical value holding period 502 is made to be sufficient for the monitor channel output 105 to be able to settle to a substantially accurate measurement result. If the logical value held at the end of the data burst is '1', then the laser modulation current 115 is returned to a '0' at the end of this extension period 502 by means of a command edge 505 to the data modulation circuitry 110. In this way, the laser current is reduced substantially towards its extinction state by means of a high bandwidth circuit function in some very short time (in this example, 10 s of picoseconds), rather than by a possibly much slower bias current control. Immediately this state has been reached, the bias current 114 is turned off by the bias control signal 506 and decays to zero before the end of the time permitted by the relevant standard. By these or substantially similar means it is therefore possible for the monitor output 105 to deliver substantially accurate representations of the true prevailing optical outputs during both logical '1' and logical '0' data states, without significant restrictions arising from particular data patterns and/or run lengths as is often the case in prior art. From these measurements taken from alternate data bursts the analogue values may be converted into digital form 113 and a simple algorithm may be employed to complete a system to determine the prevailing extinction ratio and the average optical power, and further to determine any required adjustments to the modulation current and the bias current such that the ER and average power correspond with the desired target values for the system.

It is an advantage of the invention that the control system so comprised measures the steady state optical values for both logical '1' and logical '0' free from significant assumptions regarding the performance of other parts of the system and substantially not derived from indirect calculations.

It is a further advantage of the invention that the intermittent nature of the burst mode signal does not detract from the operation of the control system.

Figure 6:
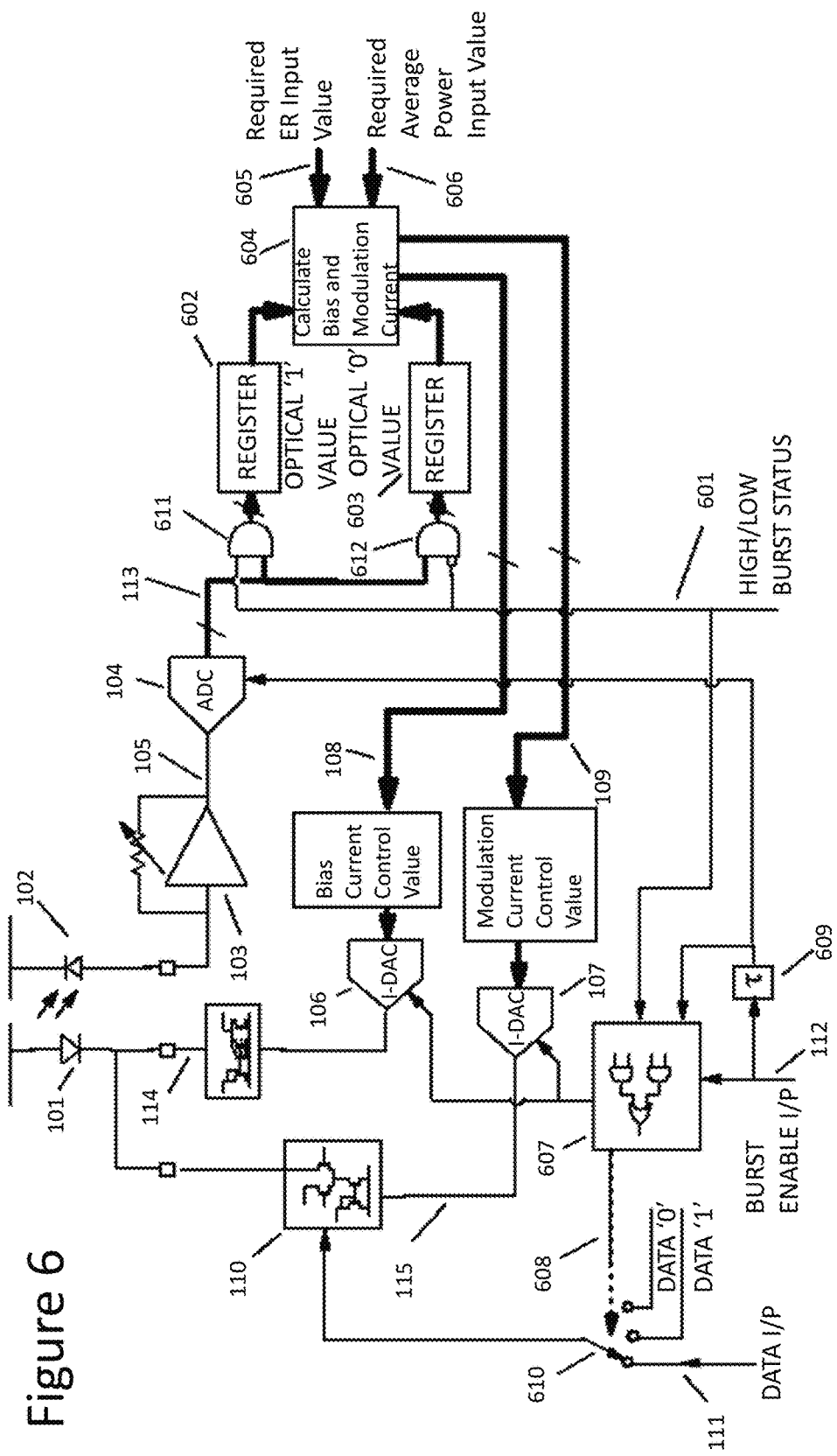
FIG. 6 shows an embodiment of the invention.

FIG. 6 shows an arrangement according to an embodiment of the invention. The bias current 114 is set by a current output digital-to-analogue converter (DAC) 106 and the modulation current 115 is similarly set by another DAC 107. The controlling digital values for said DACs are determined by a digital calculation function 604, which takes its inputs from the system feedback values and the digital inputs corresponding the desired average power 606 and modulation depth (or ER 605). The modulation circuitry 110 is no longer controlled directly by the data input 111 but can now have its input switched between the data input 111, and logic '1' or logic '0' by means of selection circuitry, for example a selector switch function 610. When the burst enable signal 112 is asserted to indicate the start of a data burst the logical control function 607 will set the modulation input path using selector 610 to pass the incoming data directly to the modulation circuitry 110. A modulated optical signal will be generated by the laser 101 and a band-limited representation of same 105 will be created by the monitor diode 102 and its associated amplifier 103. This monitor signal 105 is converted to a digital value 113 by an analogue-to-digital converter (ADC) 104. During the payload of the data burst this output 113 may be used but it will be of limited value due to the bandwidth limitations of this channel. At the end of the data payload the burst enable signal will indicate the end of this transmission. In a conventional system, this would disable the modulation 115 and bias 114 currents completely.

According this embodiment of the present invention, the control logic 607 takes a defined delay time 609 and holds the bias and modulation currents on. An additional burst status signal 601 is provided by the embodiment that changes logical value with each data burst, effectively designating bursts as "HIGH" or "LOW". As an example embodiment, if the burst is designated as "HIGH" then during the delay at the end of the burst, the modulation input selector 610 is set to a logical '1' 503 such that the optical output is held at the high level 303. This modulation optical value is held for a time period 502 long enough for the monitor channel to make an accurate measurement despite its limited bandwidth; but still short enough that there is time to fully extinguish the laser. The monitor channel output 105 is converted to digital form 113 and then passed at a suitable time instant to a first register 602 via a logical gate 611 enabled by the burst status signal 601. This register then provides the measured optical high value to the calculation function 604.

At the end of this delay period 503 the modulation selector is set to a logical '0' to remove the laser modulation current 115 using the normal modulation circuitry and hence reduce the optical output very rapidly. At the same instant 505, the control logic 607 commands the bias current DAC 106 and the modulation current DAC 107 to cease outputting current, such that the laser 101 becomes completely extinguished within the period 404 required by the relevant communication standard.

If the burst is designated as "LOW" by the burst status signal 601 then at the end of the data payload the modulation selector 610 is set to a logical '0' 504 such that the laser output is at the low level 302. Even if the last symbol in the burst data payload required a logical '1' at the end of the burst, then the transition to a logical '0' can be effected with great speed by using the normal modulation circuitry 110. Again, this modulation optical value is held for a time period 502 long enough for the monitor channel to make an accurate measurement despite its limited bandwidth; but still short enough that there is time to fully extinguish the laser.

The monitor channel output 105 is then converted to digital form 113 and then passed at a suitable time instant to a second register 603 via a logical gate 612 enabled by the logical complement of the burst status signal 601. This register then provides the measured optical low value to the calculation function 604.

A convenient and efficient arrangement will be to designate the bursts as "HIGH" and "LOW" in an alternating manner. However, the invention may also employ some other sequence of "HIGH" and "LOW" states where there may be a need to obtain an estimate of one level faster than the other, or to take account of some other requirements of the system.

The calculation function 604 then takes the required target value inputs for the average 606 and ER 605 and using a simple calculation derives the new bias current control value 108 and the new modulation current value 109 such that the errors between the calculated ER and average values and the corresponding required ER and average values are minimised and brought to negligible or acceptable levels. This process may take several iterations of "HIGH" and "LOW" bursts and the precise rate of convergence of the system will depend on coefficients and scale factors chosen for a particular application.

Figure 7:
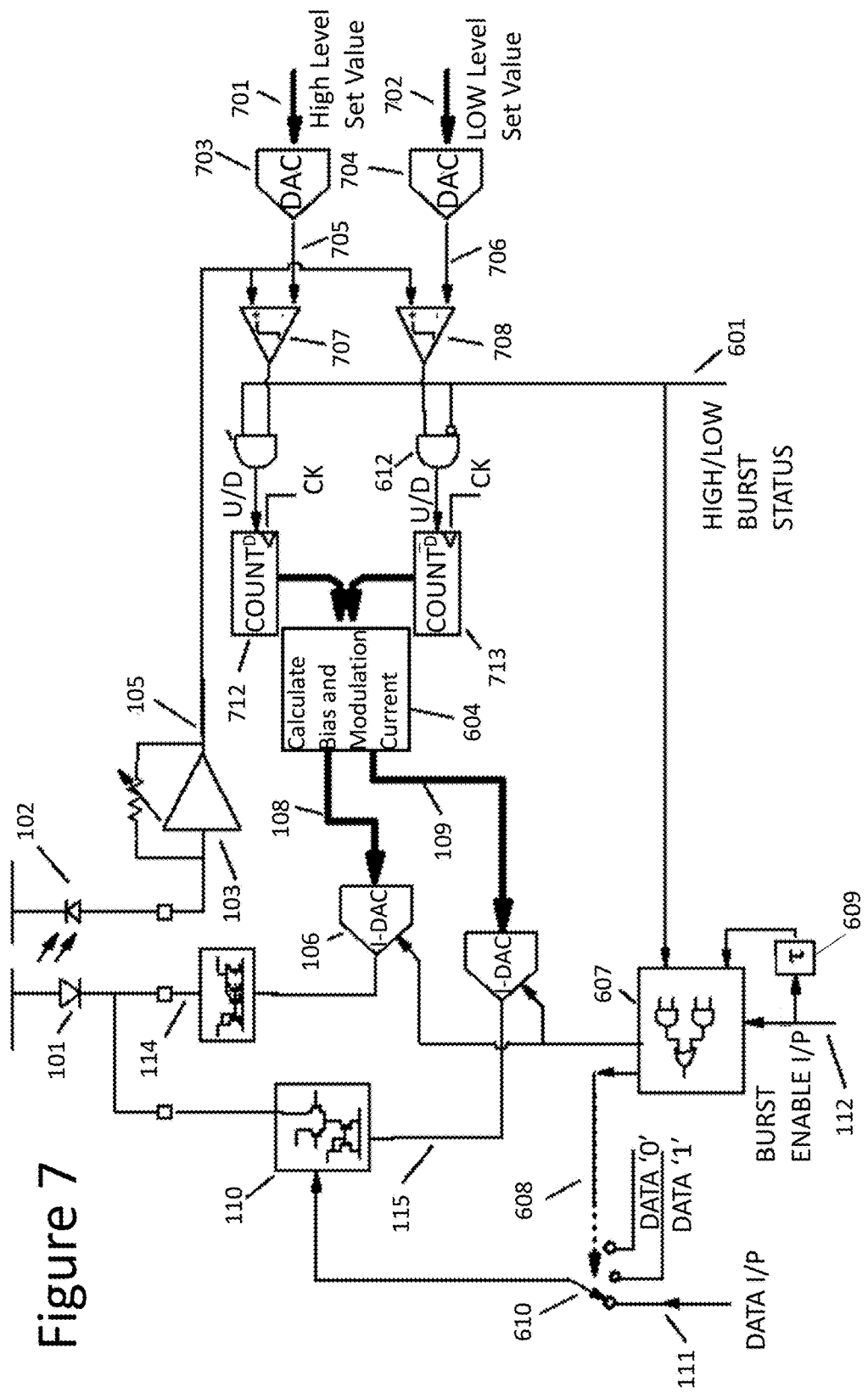
FIG. 7 shows a further embodiment of the invention.

FIG. 7 shows an arrangement according to a second embodiment of the invention. In this arrangement, the derivation of the corrections to the bias and modulation currents are performed with more analogue processing. The laser modulation and monitor circuits are substantially as in the previous arrangement according to FIG. 6. Instead of converting the output of the monitor channel 105 into digital form, the analogue value is compared directly with another analogue value derived from reference analogue values generated by DACs from user defined input values. The operation is as follows:

The desired optical high value 701 and desired optical low value 702 are supplied from the user in explicit form and used to control two DACs 703 and 704 respectively. The outputs 705 and 706 of these DACs are equivalent to the desired monitor photodiode amplifier 105 outputs for optical '1' and optical '0' under ideal optical bias conditions and desired modulation value. A person skilled in the art will also immediately recognise that the desired operating current may also be supplied as an average value and an ER value, and then converted to equivalent high and low values by means of simple arithmetic circuits.

The voltages 105 and 705 should be substantially identical when the laser is operating in the logical high state under ideal conditions. The voltages 105 and 706 should be substantially identical when the laser is operating in the logical low state under ideal conditions. The comparators 703 and 704 are used to determine the sign of any difference between the indicated levels and the desired levels.

When the data burst is designated "HIGH", then at the end of the holding period 502 the comparator 707 output is passed via logic gate 611 controlled by the burst status signal 601 to a counter 712 wherein it is used to control a counting process either up or down, depending on the sign of the output of the comparator 707. If the monitor signal 105 is less than the reference signal 705 from the DAC 703 at this instant, then the counter will decrement indicating a negative error for the high optical state. If the monitor signal 105 is greater than the reference signal 705 then the counter 712 will increment.

Similarly, when a data burst is designated as "LOW" then at the end of the holding period 502 then the comparator 708 output is passed via logic gate 612 controlled by the complement of the burst status signal 601 to a counter 713 wherein it is used to control a similar counting process either up or down, depending on the sign of the output of the comparator 708. If the monitor signal 105 is less than the reference signal 706 from the DAC 704 at this instant, then the counter will decrement indicating a negative error for the low optical state. A corresponding increment will take place if the monitor output is higher than the replica at this instant.

From the values from the counters 712 and 713 at any given time the logical arithmetic block 604 can easily calculate the bias control value 108 and the modulation value 109 needed to correct the error observed between the monitor output 105 and the replica path 710. Over a number of data bursts, the system will adjust the currents so that the errors are minimised, and hence the laser will be operating at substantially the desired average optical output and with substantially the desired ER.

Whilst this invention has been described with reference to particular examples and possible embodiments thereof these should not be interpreted as restricting the scope of the invention in any way. It is to be made clear that many other possible embodiments, modifications and improvements may be incorporated into or with the invention without departing from the scope and spirit of the invention as set out in the claims.

What is claimed is:

1. A system for transmitting a sequence of at least two data bursts in a fibre optical communications system, the system comprising:
   selection circuitry configured to select one of a data input value, a logical high value or a logical low value such that the selection circuitry selects the data input value during a data transmission period during a defined burst period and selects one of the logical high value and the logical low value during an extension time period during the defined burst period and immediately following the data transmission period, such that for the sequence of at least two bursts, at least one burst has a logical low value extension period and at least one burst has a logical high value extension period;
   drive circuitry configured to apply a current to a laser diode, the current corresponding to the value selected by the selection circuitry during the defined burst period or a zero value otherwise, the current being such that the laser diode is configured to provide an optical output;
   an optical sensor module configured to provide a sensor module output corresponding to the optical output of the laser diode; wherein the sensor module output is configured to provide an electrical output proportional to the laser diode's optical output corresponding to the logical high value and the logical low value in the sequence of at least two bursts; and
   a controller configured to receive values regarding desired minimum and maximum optical output power levels of the laser diode and to receive the electrical output from the optical sensor module proportional to the optical output power level corresponding to the logical high and the logical low values; wherein the controller is configured to use the received information to provide control values for the drive circuitry.

2. A system as claimed in claim 1, wherein the optical sensor module comprises a photodiode output power detector.

3. A system as claimed in claim 1, wherein the optical sensor module comprises an optical sensor and a trans-impedance amplifier, the trans-impedance amplifier being configured to provide the sensor module output.

4. A system as claimed in claim 1, wherein the control values are configured to control the average power of the optical output of the laser diode.

5. A system as claimed in claim 1, wherein the control values are configured to control the peak power of the optical output of the laser diode.

6. A system as claimed in claim 1, wherein the control values are configured to control the modulation index of the optical output of the laser diode.

7. A system as claimed in claim 1, wherein the current applied to the laser diode comprises a steady element and a variable element.

8. A system as claimed in claim 1, wherein the drive circuitry is configured to set the current applied to the laser diode dependent on a combination of a bias control value and a modulation control value.

9. A system as claimed in claim 8 wherein the control values are configured to control the drive circuitry to set the at least one of a bias current and a modulation current applied to the laser diode.

10. A system as claimed in claim 1, wherein the drive circuitry comprises bias circuitry configured to provide a bias current to the laser diode.

11. A system as claimed in claim 1, wherein the drive circuitry comprises modulation circuitry configured to provide a modulation current to the laser diode.

12. A system as claimed in claim 1, wherein the drive circuitry is configured to set the current applied to the laser diode dependent on a combination of an average value and a modulation value.

13. A system as claimed in claim 1, wherein the burst period is gated by a burst enable signal.

14. A system as claimed in claim 1 wherein the control values control the drive circuitry to deliver the desired minimum and maximum optical output power levels of the laser diode.

15. A system as claimed in claim 1 wherein the extension time period is greater than a settling time of the sensor module output.

16. A system as claimed in claim 1 wherein the selection circuitry alternately selects one of the logical high value and logical low value for each consecutive extension time period.

17. A system as claimed in claim 1 wherein the selection circuitry selects the logical high value or the logical low value for each consecutive extension time period according to a pre-defined sequence.

18. A system as claimed in claim 1 wherein the selection circuitry selects the logical low value immediately after an extension time period where the logical high value has been selected.

19. A system as claimed in claim 1 wherein the selection circuitry comprises a selector switch function.

20. A system as claimed in claim 1 wherein the bandwidth of the selection circuitry is configured to switch between the data input, the logical high value and the logical low value in a time significantly less than that of the extension time period.

21. A method for transmitting a sequence of at least two data bursts in a fibre optical communications system, the method comprising:
   selecting one of a data input value, a logical high value or a logical low value such that the data input value is selected during a data transmission period during a defined burst period and one of the logical high value and the logical low value is selected during an extension time period during the defined burst period and immediately following the data transmission period, such that for the sequence of at least two bursts, at least one burst has a logical low value extension period and at least one burst has a logical high value extension period;
   applying a current to a laser diode, the current corresponding to the selected value during the defined burst period or a zero value otherwise, the current being such that the laser diode is configured to provide an optical output;
   determining an electrical output proportional to a laser diode's optical output corresponding to the logical high value and the logical low value in the sequence of at least two bursts by using a sensor module output corresponding to the optical output;
   receiving values regarding desired minimum and maximum optical output power levels of the laser diode; and
   providing control values for the current applied to the laser diode based on the electrical output proportional to the optical output corresponding to the logical high and the logical low value and the received values regarding desired minimum and maximum optical output power levels of the laser diode.

\* \* \* \* \*